United States Patent

Wijdenes et al.

[11] Patent Number: 5,329,131
[45] Date of Patent: Jul. 12, 1994

[54] OPTO-ELECTRONIC COUPLER HAVING IMPROVED MOISTURE PROTECTIVE HOUSING

[75] Inventors: Jacob Wijdenes, Eindhoven; Antonius L. M. Gieben, Nijmegen, both of Netherlands

[73] Assignee: U.S. Philips Corporation, New York, N.Y.

[21] Appl. No.: 871,459

[22] Filed: Apr. 21, 1992

[30] Foreign Application Priority Data

May 17, 1991 [EP] European Pat. Off. ........ 91201193.9

[51] Int. Cl.$^5$ ............................................. G02B 27/00
[52] U.S. Cl. ...................................... 250/551; 250/239
[58] Field of Search ................ 250/551, 239; 307/311; 258/80-81, 787-793, 795

[56] References Cited

U.S. PATENT DOCUMENTS

| | | | |
|---|---|---|---|
| 4,712,017 | 12/1987 | Kamasaki | 250/551 |
| 4,745,294 | 5/1988 | Kohashi et al. | 250/551 |
| 4,851,695 | 7/1989 | Stein | 250/551 |
| 4,857,746 | 8/1989 | Kuhlmann et al. | 250/551 |
| 4,980,568 | 12/1990 | Merrick et al. | 250/551 |
| 5,148,243 | 9/1992 | Merrick et al. | 250/551 |

OTHER PUBLICATIONS

Hamamatsu Product Catalog, pp. 1-17, 1990, "Photocouplers".

Primary Examiner—David C. Nelms
Attorney, Agent, or Firm—William L. Botjer

[57] ABSTRACT

The invention relates to an opto-electronic coupler comprising an optical transmitter and an optical receiver which are secured to separate connection conductors and which are electrically connected to one or more connection conductors via contact wires, the transmitter, the receiver, the contact wires and parts of the connection conductors being embedded in a primary, enveloping body, and said primary enveloping body being embedded in a secondary, non-transparent enveloping body. Couplers having a high breakdown voltage and a low percentage of rejects are obtained if the interface between the primary enveloping body and the secondary enveloping body comprises at least one zone in which the primary and the secondary enveloping bodies are adhesively interconnected, and if the interface also comprises at least one zone in which the primary and the secondary enveloping bodies are interconnected in a non-adhesive manner.

4 Claims, 1 Drawing Sheet 5,329,131

OPTO-ELECTRONIC COUPLER HAVING IMPROVED MOISTURE PROTECTIVE HOUSING

BACKGROUND OF THE INVENTION

The invention relates to an opto-electronic coupler comprising an optical transmitter and an optical receiver which are secured to separate connection conductors and which are electrically connected to one or more further connection conductors via contact wires, the transmitter, the receiver, the contact wires and parts of the connection conductors being embedded in a primary enveloping body which is embedded in a secondary, non-transparent enveloping body. Opto-electronic couplers are used in, inter alia, protection systems for securing, for example, computers and telecommunications equipment against electric voltages from peripheral equipment. Said couplers are also used in audio and video equipment.

Such an opto-electronic coupler is known per se from European Patent Specification EP 192.634. The coupler described therein comprises a LED (light-emitting diode) as the optical transmitter and a light-sensitive diode as the optical receiver, which are optically coupled to each other via a primary, transparent enveloping body. The expression "transparent enveloping body" is to be understood to mean herein that the material of this enveloping body is optically transparent to optical signals emitted by the transmitter and received by the receiver during operation of the coupler. The wavelength of said signals may be in the visible light spectrum as well as in the UV and IR spectrums.

The primary, transparent envelope of the coupler is embedded in a secondary, non-transparent envelope. The latter envelope provides the coupler with the required mechanical strength and shields the primary enveloping body from external optical signals. In the known coupler, the surface of the primary enveloping body is treated in such a manner that the primary and secondary enveloping bodies are adhesively interconnected. This adhesion improvement is attained by treating the primary enveloping body with UV light, chemical reagents, corona or plasma discharges. By virtue thereof, the penetration of moisture into the interface between the two enveloping bodies is precluded. This penetrating moisture may cause a short-circuit between the connection conductors. A short-circuit occurs at electric voltages of the order of 5–10 kV or higher. In that case, an electrical conduction path is formed between the connection conductor(s) to which the transmitter and the receiver are connected. This conduction path is formed by the film of moisture which is present between the two enveloping bodies.

The known opto-electronic coupler has disadvantages. It has for example been found that in the manufacture of the above couplers the percentage of rejects is undesirably high. A considerable number of couplers in which the known adhesion-improving measure was used did not function at all.

SUMMARY OF THE INVENTION

It is an object of the invention to eliminate or reduce the above drawback. The invention more particularly aims at providing an opto-electronic coupler having a high breakdown voltage, which can be manufactured with a low percentage of rejects.

This object is achieved by an opto-electronic coupler of the type mentioned in the opening paragraph, which is characterized according to the invention in that the interface between the primary enveloping body and the secondary enveloping body comprises at least one zone in which the primary and the secondary enveloping bodies are adhesively interconnected, and in that the interface also comprises at least one zone in which the primary and the secondary enveloping bodies are interconnected in a non-adhesive manner.

The invention is based on the experimentally gained insight that it is disadvantageous if the primary and the secondary enveloping bodies are adhesively interconnected throughout the interface. In that case, impermissibly high elastic stresses may develop in the primary enveloping body during the manufacture of the coupler. These stresses are generated when the secondary enveloping body is provided around the primary enveloping body, in particular, when there is a great difference between the coefficients of expansion of the materials of the enveloping bodies and when the secondary envelope is provided at relatively high temperatures. This is the case, in particular, when a primary enveloping body on the basis of silicone rubber and a secondary enveloping body on the basis of epoxy are used. Due to the above-mentioned stresses, the contact wires break, become detached from the diode, the transistor or the connection conductors and/or the transmitter or receiver breaks off the connection conductor. This results in a coupler which does not function. It has been found that this problem can be substantially reduced when both enveloping bodies are adhesively interconnected over only a part of their interface.

Applicants have further found that the zone of the interface where the primary and the secondary enveloping bodies are adhesively interconnected must comprise, preferably, at least 10% of the overall surface of the interface. If both enveloping bodies are adhesively interconnected over less than 10% of their interface, the risk of breakdown is still unacceptably high. On the other hand, the zone of the interface where both enveloping bodies are adhesively interconnected must comprise, preferably, maximally 60% of the overall surface of the interface. A larger adhesive zone leads to an unacceptably high percentage of rejects in the production process of the opto-couplers.

An advantageous embodiment of the invention is characterized in that the interface comprises two zones in which the primary and the secondary envelopes are adhesively interconnected, one of these zones adjoining the connection conductors to which the transmitter is electrically connected and the other zone adjoining the connection conductors to which the receiver is electrically connected, said zones being separated from each other by a third zone of the interface, in which zone the primary envelope and the secondary are interconnected in a non-adhesive manner.

In the latter configuration of the opto-electronic coupler according to the invention, the adhesive zones adjoin the connection conductors. The risk of moisture penetration is particularly high in the boundary area between the secondary envelope and the connection conductors. By making the adhesive zones border on the connection conductors, any penetration of moisture is precluded. Thus, moisture cannot penetrate into the zone of the interface between the primary and the secondary enveloping bodies where said bodies are interconnected in a non-adhesive manner

BRIEF DESCRIPTION OF THE DRAWING

The invention will be explained in greater detail by means of exemplary embodiments and with reference to the accompanying drawing, in which.

It is noted that, for clarity, not all components are drawn to scale. Since the three Figures depict the same coupler, identical components in the various Figures bear the same reference numeral.

DETAIL DESCRIPTION OF THE PREFERRED EMBODIMENTS

Figure 1:
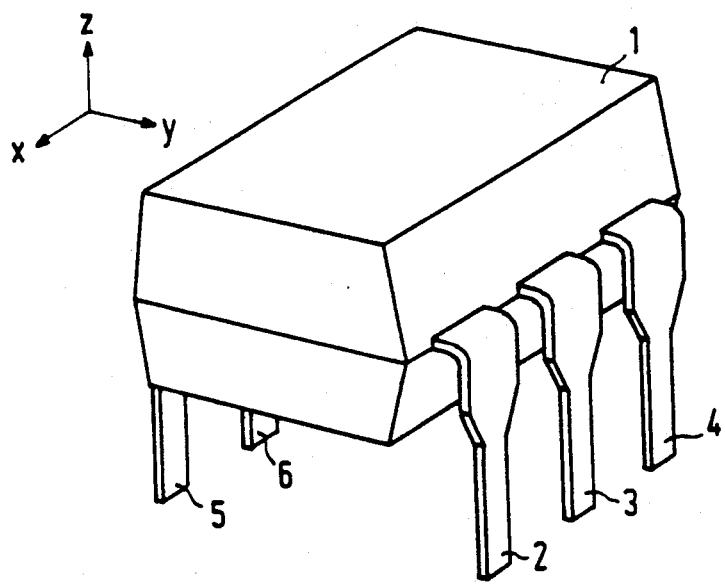
FIG. 1 is an elevational view of an opto-electronic coupler according to the invention.

FIG. 1 shows an opto-electronic coupler according to the invention. Said coupler comprises a secondary enveloping body 1 of epoxy. The composition of the envelope is selected such that it is impenetrable to the optical radiation emitted by the optical transmitter in operation and to which the optical receiver is sensitive. From each of two opposite sides of the envelope project three connection conductors 2, 3, 4 and 5, 6, 7, respectively, the latter three only partly being shown in FIG. 1.

Figure 2:
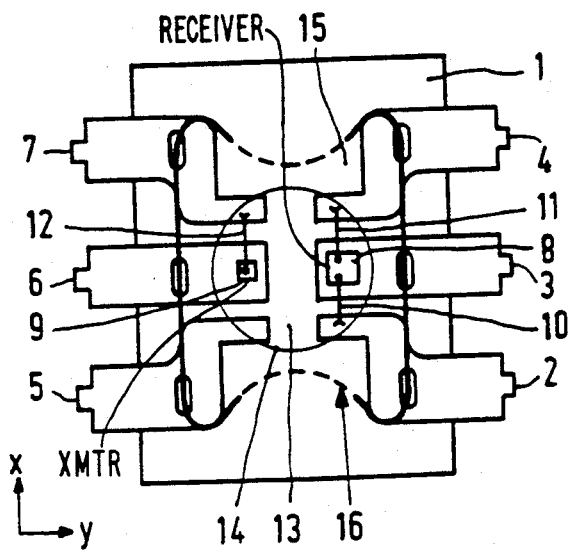
FIG. 2 is a diagrammatic cross-sectional view in the xy-plane of the opto-electronic coupler according to FIG. 1.

FIG. 2 is a diagrammatic cross-sectional view of the coupler of FIG. 1 in the xy-plane of the coordinate system indicated in FIG. 1. An optically sensitive receiver 8 in the form of a diode or transistor and an optical transmitter 9 in the form of a LED are secured and electrically connected to the connection conductors 3 and 6, respectively, by means of an electrically conductive adhesive. For example, a silicon npn phototransistor is used as the receiver and, for example, a GaAs diode which can be activated in the infrared region is used as the transmitter. The optical receiver 8 is electrically connected to connection conductors 2 and 4 via gold contact wires 10 and 11, respectively. The optical transmitter 9 is electrically connected to connection conductor 7 by a contact wire 12 of Au.

Receiver 8, transmitter 9, contact wires 10-12 and a part of the connection conductors 2-7 are embedded in a transparent, primary enveloping body which, in the present case, consists of silicone rubber. Said primary enveloping body comprises a central body of clear silicone rubber 13 the boundary of which is indicated by line 14. During operation of the coupler, the receiver 8 and the transmitter 9 are in optical contact with each other via said central enveloping body 13. Said central body is coated with a layer of white silicone rubber 15, the boundary of which is indicated by line 16. The silicone rubber used for the central body can also be used for this layer, which rubber is further mixed with, for example, titanium dioxide which imports a white colour to the rubber. The white silicone rubber serves as a reflective layer for the optical signals generated in the central body of transparent silicone rubber. The presence of such a reflective layer increases the optical sensitivity of the coupler.

The primary enveloping body 13, 15 is embedded in a secondary enveloping body 1 of a thermocuring epoxy compound. Said compound has been blackened by mixing the epoxy with a black filler such as, for example, soot. As a result thereof, external optical signals cannot reach the primary enveloping body. The secondary enveloping body provides the coupler with the necessary mechanical strength.

Figure 3:
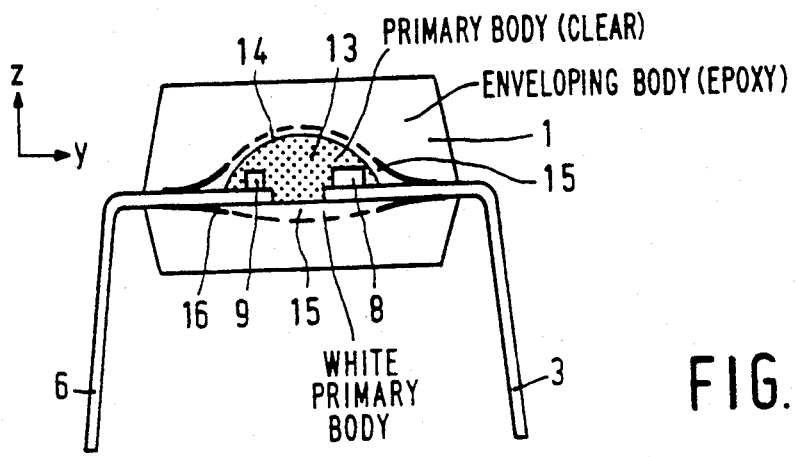
FIG. 3 is a diagrammatic cross-sectional view in the xz-plane of the opto-electronic coupler according to FIG. 1.

FIG. 3 is a diagrammatic cross-sectional view of the inventive coupler of FIG. 1 in the yz-plane of the coordinate system indicated in FIG. 1. Said Figure clearly shows how the central enveloping body 13 of transparent silicone rubber is surrounded by layer 15 of white silicone rubber and that transmitter 9 and receiver 8 are embedded in the transparent silicone rubber.

Line 16 in FIGS. 2 and 3 forms part of the interface between the primary and the secondary envelope. The zones of the interface where the primary enveloping body and the secondary enveloping body are adhesively interconnected are diagrammatically indicated by a thick, unbroken part of line 16. Said zones adjoin the connection conductors to which the transmitter and the receiver are electrically connected. Said two zones are separated from each other by a zone where the primary and the secondary enveloping bodies are interconnected in a non-adhesive manner. In FIGS. 2 and 3, said zone is diagrammatically represented by the dashed part of line 16.

The opto-electronic coupler according to the invention is manufactured as follows. An optical transmitter (for example a LED) and an optical receiver (for example a light-sensitive diode or transistor) are secured on two separate connection conductors of a lead frame by means of an electrically conductive adhesive. The transmitter and the receiver are electrically conductively connected to further connection conductors of the lead frame by means of contact wires which are preferably made of gold. A drop of transparent enveloping substance is provided on the lead frame so that the transmitter, the receiver, the contact wires and parts of the connection conductors are embedded. The enveloping substance preferably consists of a transparent silicone rubber. Said drop of enveloping substance is coated with, for example, a white reflective layer of, for example, silicone rubber mixed with titanium dioxide. If both the transparent enveloping substance and the reflective layer are based on silicone rubber a satisfactory mutual adhesion is obtained.

The surface of the primary enveloping body is treated in such a manner that a suitable adhesion is obtained after the secondary enveloping body has been provided. To this end, a portion of the surface is treated with, for example, UV-ozone, chemical reagents, arc, plasma discharges or corona discharges. Treatment with corona discharge is preferred. Said treatment enables a well-defined portion of the surface of the primary enveloping body to be treated in a simple manner. The other treatments are more suitable for treating the whole surface.

Using the corona treatment, preferably, two zones of the surface of the primary enveloping body are treated, one of the zones adjoining the connection conductors to which the transmitter is electrically connected and the other zone adjoining the connection conductors to which the receiver is electrically conductively connected. Said two zones are separated from each other by a third zone which is not treated with corona discharges.

The secondary enveloping body is provided after the surface of the primary enveloping body has been subjected to an adhesion-improving treatment. The secondary enveloping body consists of, for example, a thermocuring epoxy compound which is provided at an increased temperature of, for example, 175° C. By virtue of the fact that specific zones of the surface of the primary enveloping body have been subjected to an adhesion-improving treatment, a satisfactory adhesion between the primary and the secondary enveloping bodies is obtained at these locations.

An even more advantageous effect occurs when the local adhesion-improving treatment is carried out in the vicinity of the connection conductors in such a manner that said conductors are also partially treated. In this case, it is found that the secondary enveloping body adheres better to the connection conductors. By virtue thereof, the penetration of moisture along the interface between the secondary enveloping body and the connection conductors is impeded.

We claim:

1. An opto-electronic coupler comprising an optical transmitter and an optical receiver which are secured to separate connection conductors and which are electrically connected to one or more further connection conductors by contact wires, the optical transmitter, the optical receiver, the contact wires and parts of the separate and further connection conductors being embedded in a primary enveloping body which is embedded in a secondary, nontransparent enveloping body, characterized in that the interface between the primary enveloping body and the secondary enveloping body comprises at least one first zone in which the primary and the secondary enveloping bodies are adhesively interconnected, and in that the interface comprises at least one second zone in which the primary and the secondary enveloping bodies are interconnected non-adhesively.

2. An opto-electronic coupler as claimed in claim 1, characterized in that the first zone in which the primary and the secondary envelopes are adhesively interconnected comprise minimally 10 and maximally 60% of the overall surface of the interface.

3. An opto-electronic coupler as claimed in claim 2, characterized in that the interface comprises two first zones in which the primary and the secondary envelopes are adhesively interconnected, one of these first zones adjoining the connection conductors to which the transmitter is electrically connected and the other first zone adjoining the connection conductors to which the receiver is electrically connected, said zones being separated from each other by said second zone of the interface, in which second zone the primary envelope and the secondary envelope are interconnected in a non-adhesive manner.

4. An opto-electronic coupler as claimed in claim 1 wherein said adhesive connection of said first zone comprises a surface treatment of one of said primary and secondary bodies.

* * * * *